(12) United States Patent
Kathman et al.

(10) Patent No.: US 7,751,659 B2
(45) Date of Patent: Jul. 6, 2010

(54) OPTICAL APPARATUS

(75) Inventors: Alan D Kathman, Charlotte, NC (US); James E Morris, Charlotte, NC (US); John Barnett Hammond, Charlotte, NC (US); Michael R. Feldman, Huntersville, NC (US)

(73) Assignee: Tessera North America, Inc., Charlotte, NC (US)

( * ) Notice: Subject to any disclaimer, the term of this patent is extended or adjusted under 35 U.S.C. 154(b) by 0 days.

(21) Appl. No.: 11/783,530

(22) Filed: Apr. 10, 2007

(65) Prior Publication Data

US 2007/0187789 A1 Aug. 16, 2007

Related U.S. Application Data

(63) Continuation of application No. 10/809,914, filed on Mar. 26, 2004, now Pat. No. 7,224,856, and a continuation-in-part of application No. 09/983,278, filed on Oct. 23, 2001, now Pat. No. 6,798,931.

(60) Provisional application No. 60/457,664, filed on Mar. 26, 2003.

(51) Int. Cl.
*G02B 6/12* (2006.01)
*G02B 6/26* (2006.01)
*G02B 6/36* (2006.01)

(52) U.S. Cl. .............. 385/14; 385/18; 385/53

(58) Field of Classification Search ............ 385/14, 385/16, 53
See application file for complete search history.

(56) References Cited

U.S. PATENT DOCUMENTS

| | | | |
|---|---|---|---|
| 4,873,566 A * | 10/1989 | Hokanson et al. ............ 257/98 |
| 4,945,400 A | 7/1990 | Blonder et al. |
| 5,011,256 A | 4/1991 | Johnson et al. |
| 5,926,696 A | 7/1999 | Baxter et al. |
| 6,102,068 A * | 8/2000 | Higdon et al. ............ 137/341 |
| 6,104,690 A * | 8/2000 | Feldman et al. ........ 369/112.26 |
| 6,184,066 B1 * | 2/2001 | Chino et al. ................ 438/118 |
| 6,249,136 B1 | 6/2001 | Maley |
| 6,509,807 B1 * | 1/2003 | Anthony et al. ............... 333/12 |
| 6,581,279 B1 | 6/2003 | Gidon et al. |
| 6,597,713 B2 * | 7/2003 | Ouchi ......................... 372/36 |
| 6,606,011 B2 * | 8/2003 | Anthony et al. ............... 333/12 |
| 6,969,204 B2 | 11/2005 | Kilian |
| 6,981,804 B2 * | 1/2006 | Jian ........................... 385/88 |
| 2001/0010702 A1 * | 8/2001 | Tanaka ........................ 372/99 |
| 2002/0068373 A1 * | 6/2002 | Lo et al. ...................... 438/33 |
| 2002/0126940 A1 * | 9/2002 | Kathman et al. ............. 385/14 |

(Continued)

FOREIGN PATENT DOCUMENTS

EP 0 881 671 12/1998

(Continued)

*Primary Examiner*—K. Cyrus Kianni
(74) *Attorney, Agent, or Firm*—Lee & Morse, P.C.

(57) ABSTRACT

An optical chassis includes a mount substrate an optoelectronic device on the mount substrate, a spacer substrate, and a sealer substrate. The mount substrate, the spacer substrate and the sealer substrate are vertically stacked and hermetically sealing the optoelectronic device. An external electrical contact for the optoelectronic device is provided outside the sealing. At least part of the optical chassis may be made on a wafer level. A passive optical element may be provided on the sealer substrate or on another substrate stacked and secured thereto.

14 Claims, 6 Drawing Sheets

U.S. PATENT DOCUMENTS

| | | | |
|---|---|---|---|
| 2002/0176459 A1* | 11/2002 | Martinsen | 372/34 |
| 2003/0002809 A1* | 1/2003 | Jian | 385/73 |
| 2003/0020091 A1* | 1/2003 | Tungare et al. | 257/190 |
| 2003/0162214 A1* | 8/2003 | Heller et al. | 435/6 |
| 2004/0113549 A1* | 6/2004 | Roberts et al. | 313/512 |
| 2006/0244118 A1* | 11/2006 | Roberts et al. | 257/686 |

FOREIGN PATENT DOCUMENTS

| | | |
|---|---|---|
| EP | 0 975 072 | 1/2000 |
| EP | 1 130 646 | 9/2001 |
| WO | WO 00/11714 | 3/2000 |
| WO | WO 01/61748 | 8/2001 |

* cited by examiner

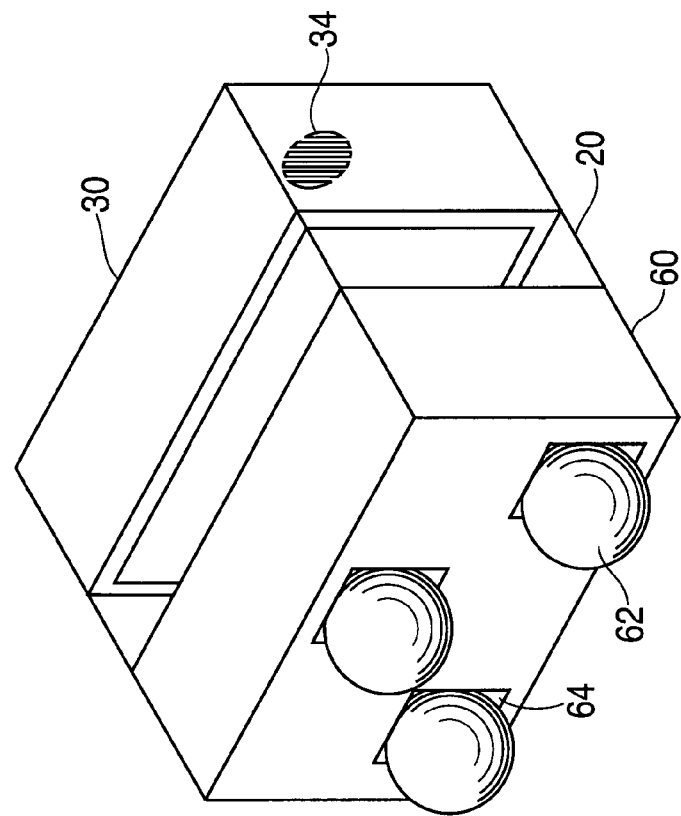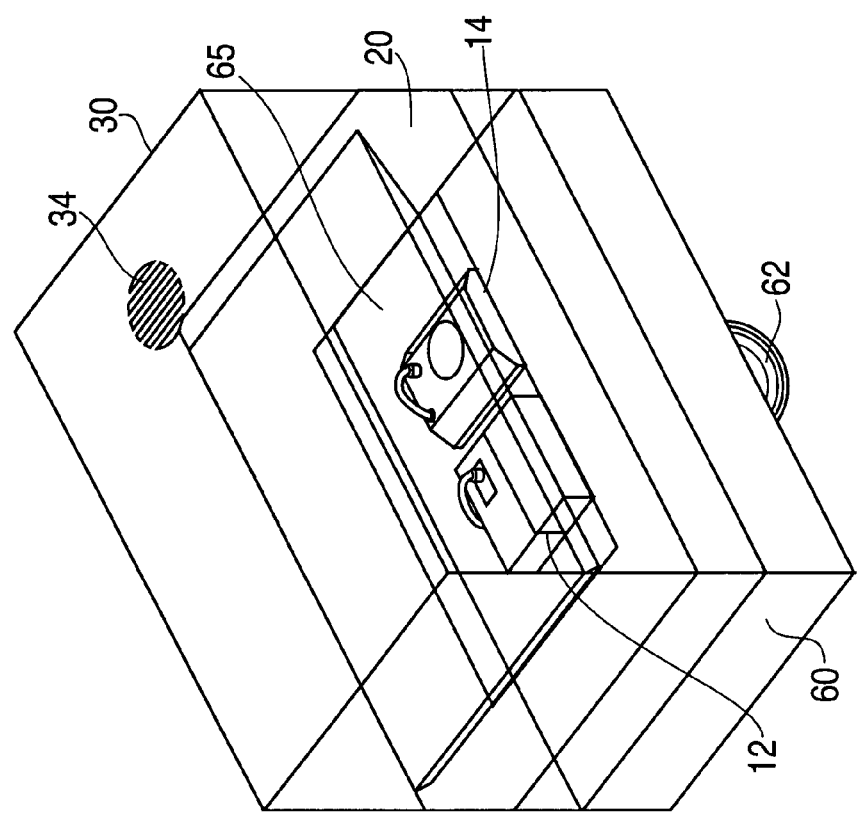

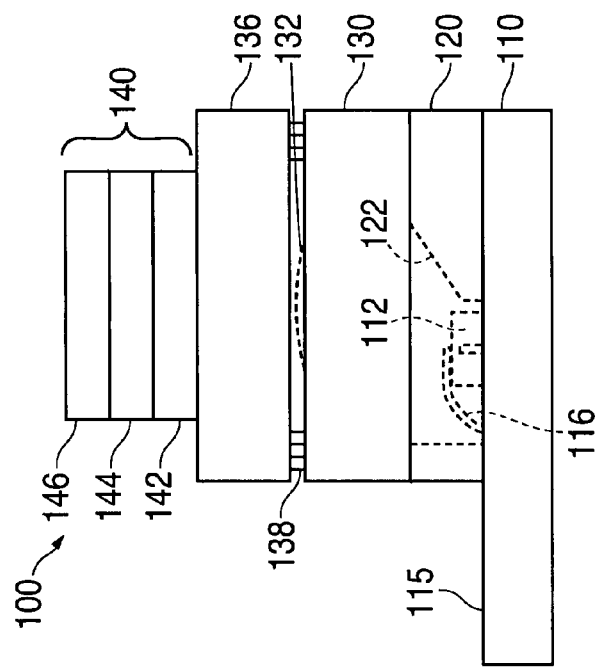
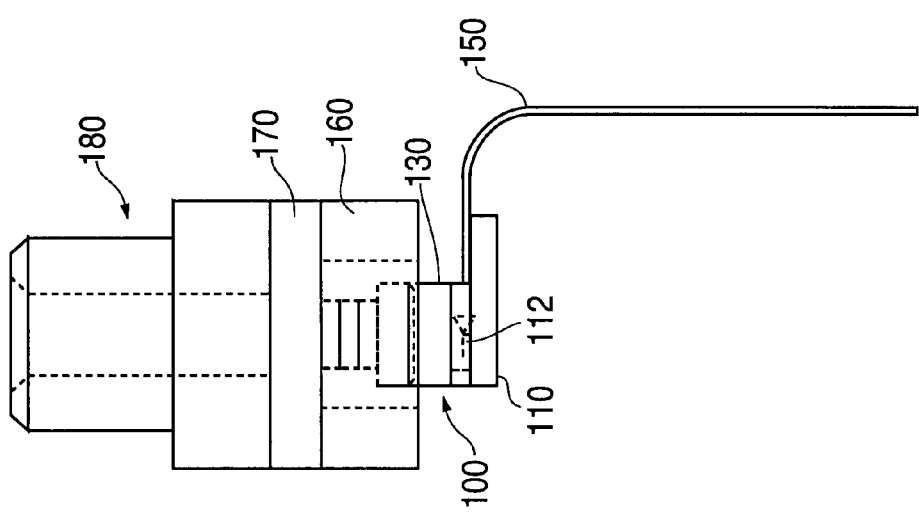

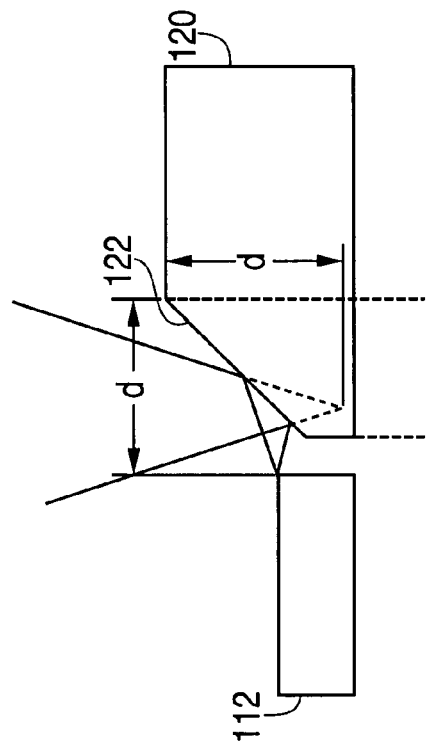
FIG. 13b
FIG. 13a
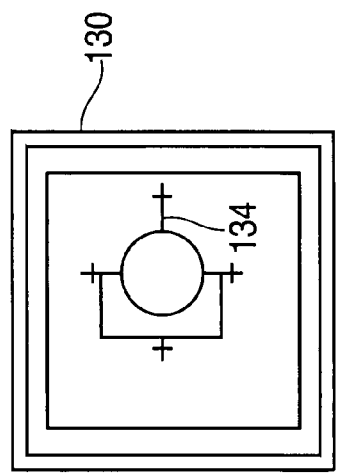
FIG. 14b
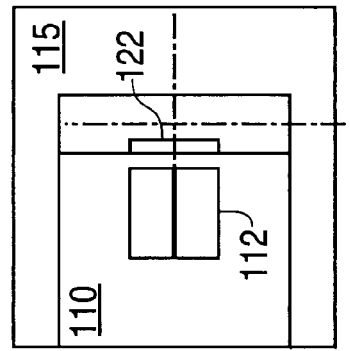
FIG. 14a

OPTICAL APPARATUS

CROSS-REFERENCES TO RELATED APPLICATIONS

This is a continuation application based on pending application Ser. No. 10/809,914, filed Mar. 26, 2004 now U.S. Pat. No. 7,224,856, which in turn claims priority under 35 U.S.C. §119 to U.S. Provisional Application Ser. No. 60/457,664 filed on Mar. 26, 2003, entitled "Wafer Based Optical Chassis" and under 35 U.S.C. §120 as a continuation-in-part to U.S. application Ser. No. 09/983,278 filed Oct. 23, 2001 now U.S. Pat. No. 6,798,931, entitled "Separating of Optical Integrated Modules and Structures Formed Thereby," the entire contents of both of which are hereby incorporated by reference for all purposes.

BACKGROUND

1. Field of the Invention

The present invention is directed to a wafer based optical chassis and associated methods. More particularly, the present invention is directed to protecting active elements in an optical system and realizing electrical input/output without requiring separate packaging.

2. Description of Related Art

Active elements, such as optoelectronic chips, e.g., light sources for transmitters and detectors for receivers, are typically housed in a transistor outline (TO) can. Such a TO can is typically made of metal, has a large form factor, involves an expensive serial manufacturing process and requires active alignment with external passive optical elements. This large form factor separates the active element from an external passive optic along the optical axis, resulting in the passive optic needing to handle a more divergent beam, rendering the optic bigger, thereby further increasing the size of the system. Additionally, the TO can has electrical termination concerns, limiting the speed of the active elements.

Current trends towards miniaturization have spurred numerous small form factor designs. Most of these designs are directed to integrating the passive optical element with some connector, separate from the TO can. While this may reduce the length of the system and simplify the manufacturing of the passive optical portion of the system, the TO can, and the problems attendant therewith, are still present.

SUMMARY OF THE INVENTION

The present invention is therefore directed to a wafer based optical chassis and associated methods that substantially overcome one or more of the problems due to the limitations and disadvantages of the related art.

It is a feature of the present invention to protect an active element with an assembly including passive optical elements. It is another feature of the present invention to provide efficient electrical coupling to and from the protected active elements. It is yet another feature of the present invention to provide hermetic packaging of an active element that can at least partially be created in parallel. It is yet another feature of the present invention to provide alignment that compensates for variations arising in the manufacturing process.

At least one of the above and other features may be realized by providing an optical apparatus including a mount substrate, an optoelectronic device on the mount substrate, a spacer substrate and a sealer substrate. The mount substrate, the spacer substrate and the sealer substrate are vertically stacked and hermetically seal the optoelectronic device. The apparatus also includes external electrical contact for the optoelectronic device outside the sealing.

An interior surface of the spacer substrate may be angled and have a reflective material thereon. The electrical contact may include a metalized trench. The mount substrate and the spacer substrate may be flush. The optical apparatus as may include a ledge formed by differing widths between the mount substrate and the spacer substrate. The metalized trenches may be in the ledge or the electrical contact may be on the ledge. The electrical contact may include a conductive via on a bottom surface of the mount substrate and a conductive structure in the via. The conductive structure is a solder ball. The electrical contact may include a conductive material on at least two non-parallel surfaces of the mount substrate.

A passive optical element may be on a surface of the sealer substrate. The optical apparatus may include, above the sealer substrate, an optical block having a passive optical element on at least one surface thereof. The optical apparatus may include, above the sealer substrate, an isolator stack including first and second polarizers and a Faraday rotator sandwiched between the first and second polarizers. The optical apparatus may include, above the sealer substrate, another spacer substrate. At least two of the mount substrate, the spacer substrate and the sealer substrate are of materials with approximately same coefficients of thermal expansion. One of the at least two substrates may be silicon and the other may be Pyrex. A terminal surface of the optical apparatus may include a mating feature for mating the optical apparatus with another structure, e.g., a ferrule.

At least one of the above and other features may be realized by providing a method of aligning an active device and a lens, including providing the active device on a mount substrate, the active device having an active area on a side thereof, positioning an angled reflector relative to the active area in accordance with a radius of curvature of the lens, viewing the active area reflected by the angled reflector, and positioning the lens in accordance with the viewed active area.

At least one of the above and other features may be realized by providing a method of creating a plurality of optical apparatuses, including patterning a conductive material on a mount wafer, populating the mount substrate with optoelectronic devices in accordance with the patterning, stacking and securing a spacer substrate on the mount wafer, stacking and securing a sealer substrate on the spacer substrate, wherein the stacking and securing of the spacer substrate and the sealer substrate on the mount wafer hermetically seal the optoelectronic devices, and vertically separating the mount wafer to form the plurality of optical apparatuses. The vertically separating including exposing a portion of the conductive material outside the hermetic seal. Each optical apparatus includes a mount substrate, an optoelectronic device, a spacer substrate, a sealer substrate, and exposed conductive material.

The stacking and securing of the sealer substrate to the spacer substrate occurs before stacking and securing of the spacer substrate stacked to the mount substrate.

BRIEF DESCRIPTION OF THE DRAWINGS

The above and other features and advantages of the present invention will become readily apparent to those of skill in the art by describing in detail embodiments thereof with reference to the attached drawings, in which:

FIG. 6 an elevational perspective view of another embodiment of the optical chassis of the present invention;

FIG. 7 is a detailed perspective bottom view of the electrical interconnections of the optical chassis shown in FIG. 6;

FIG. 12A is a schematic cross-section of a specific configuration of the optical chassis of the present invention inserted in a system;

FIG. 12B is a schematic cross-section of the specific configuration of the optical chassis of FIG. 12A alone;

FIG. 13A is a schematic top view of alignment of the active optical element to the mirror;

FIG. 13B is a schematic side view of alignment of the active optical element to the mirror;

FIG. 14A is a schematic top view of alignment of the active optical element to the optics block; and FIG. 14B is a schematic bottom view of alignment features of the optics block.

DETAILED DESCRIPTION OF THE INVENTION

Figure 2:
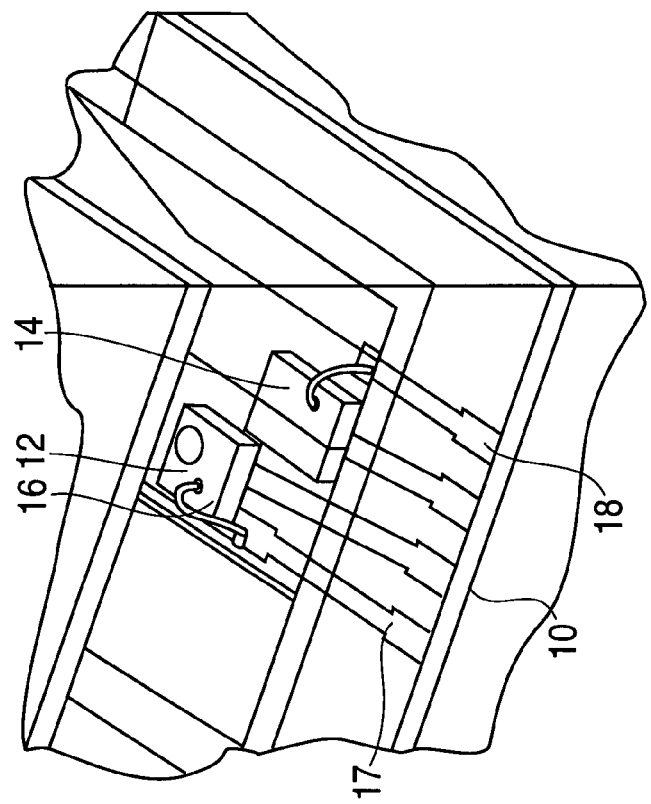
FIG. 2 is a detailed elevational perspective view of the optoelectronic devices and electrical interconnections of the optical chassis of FIG. 1.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Figure 1:
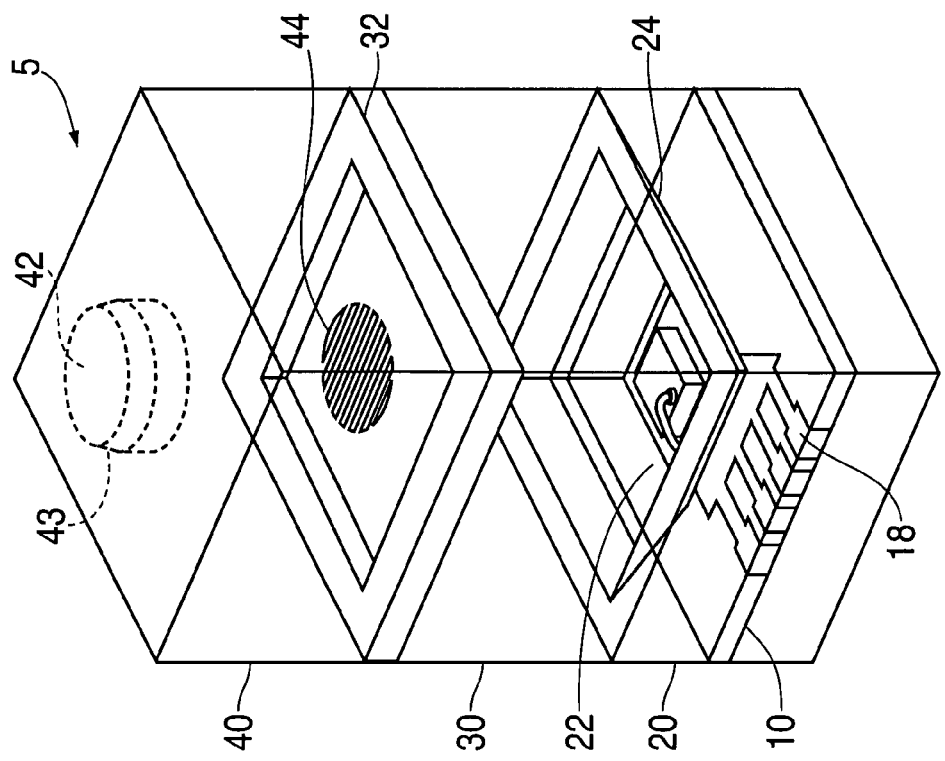
FIG. 1 is an elevational perspective view of an embodiment of the optical chassis of the present invention.

FIG. 1 shows an embodiment of an optical chassis 5 of the present invention having four substrates. These four substrates include a mount substrate 10, a spacer substrate 20, a sealer substrate 30 and an optional optics substrate 40. The mount substrate 10 serves as a mount for optoelectronic devices, here a light source 12 and a power monitor 14, and provides the electrical interconnections, here including a wire bond 16, conductive patterns 17 and metalized trenches 18. The conductive patterns 17 each include a pad for the wire bond 16 and connect the pad to the trench 18 for external communication. The conductive patterns 17 may be created by patterning conductive material on the mount substrate 10 in a known manner. The trenches 18 may be created by removing a portion of the mount substrate 10 in a conventional manner and filling this portion with conductive material. The conductive material for the trenches 18 may be provided at the same time the conductive patterns 17 are formed. The details of the mount substrate 10 can be seen more clearly in FIG. 2.

The spacer substrate 20 provides room for the beam output from the light source 12 to expand. If the optoelectronic device 12 does not have its active area on its top face, e.g., an edge emitting laser, an appropriate portion of a sidewall 22 of the spacer substrate 20 may be angled and coated with a reflective coating to appropriately direct the beam in the optical chassis 5. A hole 24 in the spacer wafer 20 may be formed by etching a silicon wafer, producing the characteristic angled sidewall 22 from such an etch. The spacer substrate 20, in conjunction with the sealer substrate 30, hermetically seals and protects the optoelectronic devices 12, 14 from the environment. The sealer substrate 30 may also include an optical element on either surface thereof, e.g., an optical element which reduces the divergence of the beam output from the light source 12.

The optional optics substrate 40 includes at least one optical element. Here, a diffractive optical element 44 on a first surface of the optics substrate 40 directs some of the light from the light source 12 to the power monitor 14, as disclosed, for example, in commonly assigned U.S. Pat. No. 6,314,223 entitled "Diffractive Vertical Cavity Surface Emitting Laser Power Monitor and System." A coupling element 42 on a second surface of the optics substrate 40 may couple the light between the optoelectronic device, here the light source 12, and further applications, e.g., a fiber. Of course, more than one functionality may be incorporated into each optical element.

If an optical element is to be provided on one or both of the surfaces of the optional optical substrate 40 or the sealer substrate 30 adjacent to one another, a separation feature 32, e.g., an indentation or stand off, may be provided on either the sealer substrate 30 or the optional optics substrate 40 to insure proper functioning of the optical element. The sealer substrate 30 is transparent. The sealer substrate 30 may be glass or may be some other transparent material that closely matches the coefficient of thermal expansion of the spacer substrate 20, e.g., Pyrex when the spacer substrate is silicon. The smaller size of the chassis 5, e.g., roughly 2 mm by 2 mm in x and y, also helps with any thermal mismatch, since there is not a lot of strain placed in the securing joints between the substrates.

Finally, when the optical chassis 5 is to be joined with another device, mating features may be provided on a terminal surface thereof. For example, if the optical chassis is to be mated with a fiber optic ferule, a standoff 43 encircling the optical element 42 may be provided. The standoff 43 may be SU-8 and provides both alignment of the optical chassis 5 with additional devices and provides separation of the optical element 42.

Figure 3:
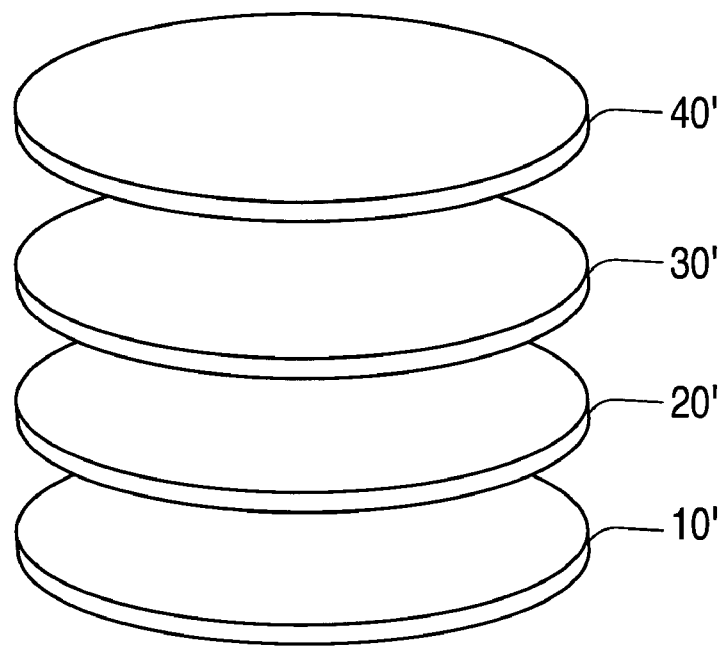
FIG. 3 is an elevational perspective exploded view of the wafer components to be used to create the optical chassis of FIG. 1.
Figure 4:
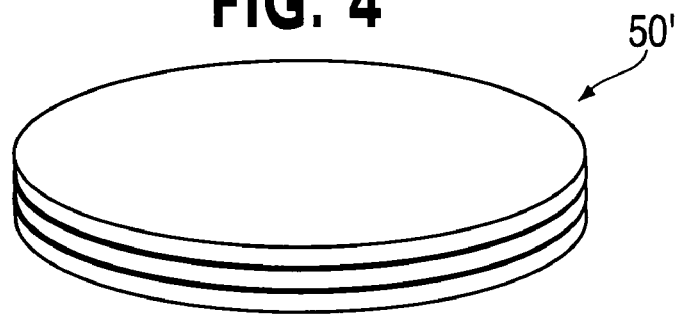
FIG. 4 is an elevational perspective view of the passive optical element wafers of FIG. 3 secured together.

As can be seen from the profile of the optical chassis 5, a plurality of each of these substrates may be created on a wafer level, secured together with other substrates in a vertical stack, and then vertically separated to form a plurality of individual optical chassis 5. As shown in FIG. 3, a mount wafer 10', a spacer wafer 20', a sealer wafer 30' and an optional optics wafer 40' are to be aligned and secured together on a wafer level. Each of these wafers includes a plurality of the respective mount substrates 10, spacer substrates 20, sealer substrates 30 and optional optical substrates 40. The top three wafers 40', 30' and 20' may be created completely on a wafer level in known fashions. These wafers may then be secured together as shown in FIG. 4 forming a secured stack wafer 50'. These wafers may be aligned and secured as set forth, for example, in U.S. Pat. No. 6,096,155 entitled "Method of Dicing Wafer Level Integrated Optical Elements."

For the mount wafer 10', a plurality of metalized trenches 18 for providing the electrical interconnections may be formed on the wafer level. The optoelectronic elements 12, 14 may then be positioned on the mount wafer 10', e.g., using pick-and-place techniques, and then wire bonded 16 to the metalized trenches 18. The metalized trenches 18 may extend along the mount wafer 10', so the separation of the mount wafer 10' will expose the metal on the edge of the mount substrate, as can be seen in FIGS. 1 and 2. The secured stack wafer 50' is then secured to the mount wafer 10' and then vertically separated to form a plurality of optical chassis 5 as shown in FIG. 1. Alternatively, the secured stack wafer may be vertically separated to form secured stack substrates, which are then bonded to the mount wafer 10'.

An alternative optical chassis 55 is shown in FIGS. 6 and 7. Here, the optional optical substrate 40 is not included. Only a diffractive optical element 34 for power monitoring and/or efficient coupling is provided on the sealer substrate 30. The spacer substrate 20 is the same as in FIG. 1. The mount substrate 60 provides different electrical connections as in FIG. 1 for the light source 12 and the power monitor 14. Here, the optoelectronic devices are again wire bonded, here to conductive pads 65. Then, on the bottom of the mount substrate 60, conductive, e.g., metalized, through holes or vias 64 and conductive structures 62, e.g., solder balls, are used to provide the electrical interconnections to the optical elements on the top surface of the mount substrate 60. These conductive structures must be large enough to obscure the hole in the mount substrate to insure the hermetic seal, to avoid creating a thermal gradient and to avoid extra oxidation. This solution is particularly useful if the mount substrate is a ceramic, since it is expensive to put solder on ceramic.

Figure 8A:
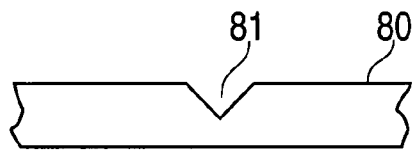
FIGS. 8a-8d are schematic drawings illustrating creation and use of an electrical connection on the face of a substrate.
Figure 8B:
Figure 8C:
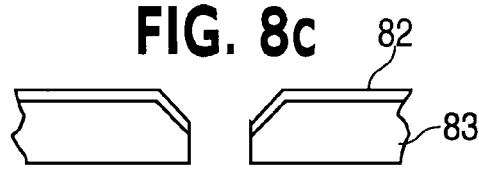

Another alternative for providing electrical interconnections to the optoelectronic element on a wafer level is shown in FIGS. 8A-8D. As shown in FIG. 8A, a saw or other etching device is used to produce V-shaped groove 81 in a wafer 80. Then, the groove 81 and the wafer 80 are coated with an electrically conductive coating 82, e.g., metal, as shown in FIG. 8B. Then, the wafer 80 is separated at the V-groove 81 and at another portion to form a mount substrate 83, as shown in FIG. 8C. The groove 81 needs to be wide enough so that an angle remains after separation. For example, if dicing is used as the separation technique, the groove will need to be wider than the blade width of the dicing saw.

Figure 8D:
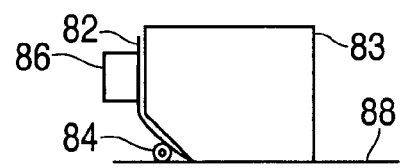

As shown in FIG. 8D, an optoelectronic device 86 is mounted on the conductive coating 82 of the mount substrate 83. A solder ball 84 or other conductive structure may then used to connect the conductive coating 82 to an electrical connection on a board 88. The other substrates 20, 30 and optionally 40 may be stacked over the mount substrate 83 as shown in the other configurations.

Figure 9:
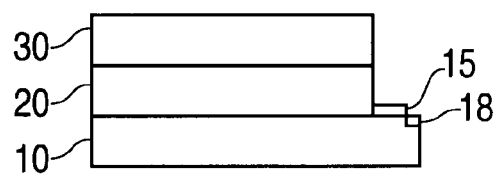
FIG. 9 is a schematic side view of another embodiment of electrical connections for the optical chassis.

Electrical input/output may also be realized as shown in FIG. 9, in which the substrates forming the optical chassis do not have the same width, thereby forming a ledge 15, with the electrical connection being realized on a portion of the chassis 5 providing the ledge 15. As shown in FIG. 9, the ledge 15 may be formed by having the mount substrate 10 extend further in at least one direction than the adjacent spacer substrate 20. The electrical contacts may be formed on the surface of the ledge or a portion of the ledge 15 may be removed to form the trenches 18 therein to increase the surface for electrical contact.

Such a ledge may be formed by die bonding a secured stacked substrate having the spacer substrate 20 and the sealer substrate 30 to the mount substrate 10. Forming such a ledge on wafer level may be realized in a number of manners, including using dicing saws of different thicknesses and dicing through opposite surfaces, e.g., flipping the wafer after partial dicing, of the secured stacked wafer, including the mount wafer 10'. Details of forming such a ledge on a wafer level are set forth in the commonly assigned, co-pending application entitled "Separating of Optical Integrated Modules and Structures Formed Thereby," filed Oct. 23, 2001, which is hereby incorporated by reference in its entirety.

Figure 10:
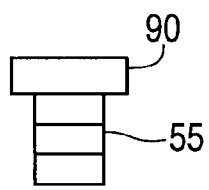
FIG. 10 is a schematic side view of the optical chassis with a larger optical element bonded thereto.
Figure 11:
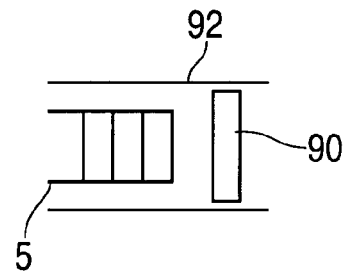
FIG. 11 is a schematic side view of the optical chassis in a common housing with a larger optical element.

If customized performance of the optical chassis is known, optional optical substrate(s) may be incorporated to provide the desired performance. Otherwise, the optical chassis of the present invention may be used to simply replace the conventional TO-can element and can have the conventional optics aligned thereto, as is currently done for the TO-can optoelectronics. Two manners of achieving this are shown in shown in FIGS. 10 and 11. As shown in FIG. 10, the vertically integrated optical chassis 55 of the present invention may have an optical element 90, including optical elements larger in the x- and/or y-direction than the optical chassis 55, die-bonded thereto. As shown in FIG. 11, the optical element 90 may be separate from but aligned with the optical chassis 55, here shown in a common housing 92. This separation reduces the alignment tolerances for the optical element 90. The sealer substrate 30 may still include optics thereon for improving the light from the light source 12, e.g., collimating or at least reducing the divergence of the light.

A specific configuration of an optical chassis in accordance with the present invention is shown in FIGS. 12A-12B. As can be seen therein, an optical chassis 100 is attached to a flex lead 150, inserted into a magnet 160, on which a fiber stop 170 and then a fiber sleeve 180 is secured. This structure may be provided on a heat sink.

The optical chassis 100 includes a mount substrate 110 having a ledge 115, a spacer substrate 120 and a sealer substrate 130. An optoelectronic device 112 and wire bonds 116 are on the mount substrate 110. The sealer substrate 130 includes a lens 132 and an angled, reflective sidewall 122. The angled, reflective sidewall 122 serves as a mirror to direct light between the optoelectronic device 112 and the fiber in the fiber sleeve 180. If the active area or facet of the optoelectronic device is not on an edge thereof, this angled, reflective sidewall 122 is not needed.

An additional spacer substrate 136, which may include additional spacing structures 138, separates the lens 132 from an isolator stack 140. The spacing structures 138 are used when a passive optical element is on one or more opposing surfaces in the stack and the surfaces would otherwise contact the passive optical element. The spacing structures may be integral with the surface or may be provided on the surface. Alternatively, these spacing structures may be on the sealer substrate 130. The electrical connection of the optoelectronic device 116 is realized using the ledge 115, as discussed in connection with FIG. 9.

The isolator stack 140 includes a first polarizer 142, a Faraday rotator 144 and a second polarizer 146. The magnet 170, which may be a ring magnet, surrounds the isolator stack 140 when the optical chassis 100 is inserted as shown in FIG.

12A, thereby completing the isolator. If the Faraday rotator 144 is a latching type, then the separate magnet 170 is not needed.

In any of the above configurations, the active elements are secured to the mount substrate such that they remain secured and withstand subsequent processing, e.g., the securing of the substrate. The construction of the optical chassis of the present invention needs to be determined in an appropriate order, with the least robust technique being performed last. The materials used for the securing of the active elements, realizing the electrical connections and the securing of the substrates must be selected in accordance with the required order. For example, the active elements may be secured on the mount substrate using a gold-tin (AuSn) solder and the substrates may then be secured using a material with a lower melting point, e.g., silver-tin (AgSn) solder.

Techniques for realizing alignment of the optical elements in the optical chassis are shown in FIGS. 13A-14B. In making micro-optical elements, there are inevitable variations in characteristics, e.g., lens thickness, radius of curvature (ROC), of individual elements. By classifying these lenses by their ROC into different groups within a range, e.g., ±1%, the variation in ROC may be compensated for with the placement of the angled surface 122 of the spacer substrate 120, as shown in FIGS. 13A-13B. Once a lens is selected for a particular optoelectronic device 112 on the mount substrate 110, the separation d between the optoelectronic device 112 and a back edge of the angled surface 122 is determined in accordance with the ROC of the lens to be used. If the angled surface 122 has an angle of approximately 45°, this distance d will be roughly equal to the height of the spacer substrate 120. Thus, this aligning of the optoelectronic device 112 with the angled surface 122 compensates for any variations in the thickness of the spacer substrate 120, as well as taking the ROC of the lens into account.

The aligning of the lens to the optoelectronic device 112 is shown in FIGS. 14A-14B. Here, the image of the active area of the optoelectronic device 112 in the reflective angled surface 122 may be used to align the lens. A bottom surface of the substrate having the lens thereon, which may be the sealer substrate 130 as shown in FIGS. 12A-12B, includes alignment features 134, here in the form of a crosshair centered on the lens on the top surface of the substrate. The alignment features 134 are then centered with the image of the active area of the optoelectronic device 112 as reflected by the angled surface 122 to insure proper alignment there between. Since the height of the optoelectronic element changes its location on the angled surface 122, by aligning the lens to the reflection from the angled surface 122, variations in the height of the optoelectronic element may be compensated for as well.

If the active area of the optoelectronic device 112 is not on a side thereof, the lens may be aligned by directly viewing the active area using alignment features 134. The variation in height of such optoelectronic devices, i.e., in the z-direction, do not significantly affect the performance. If there are no optical elements on the sealer substrate 130, the alignment thereof is not critical. Since the sealer substrate 130 is transparent, alignment features do not need to be provided thereon, as alignment features on surfaces below the sealer substrate may be viewed through it. If there are optical elements on other substrates, and the sealer substrate 130 is transparent, the same alignment techniques may be employed.

Thus, in accordance with the present invention, an optical chassis having a small form factor may be created at least partially on a wafer level, including electrical interconnections. The optical chassis of the present invention also provides a hermetic seal without requiring a TO can or other separate housing. Further, since substrates of the optical chassis are secured to one another, rather than to a carrier as in a TO can, better alignment can be maintained for longer.

Figure 5:
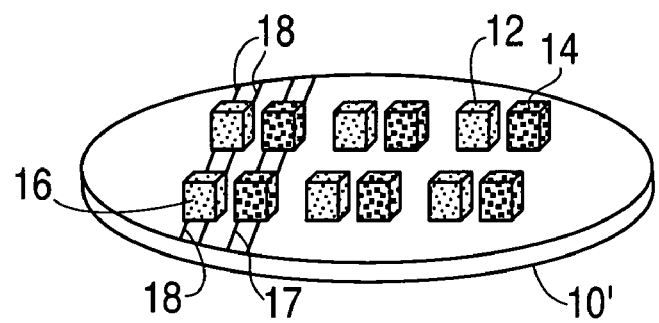
FIG. 5 is an elevational perspective view of the active element wafer to be bonded to the stack of wafers in FIG. 4 and then vertically separated to form the optical chassis of FIG. 1.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation. For example, any of the electrical interconnections shown may be used with any optical chassis embodiments. Further, additional optical substrates or elements as needed may be secured to the optical chassis. Finally, any of the configurations of the optical chassis may be created at least partially on a wafer level as discussed regarding FIGS. 3-5.

What is claimed is:

1. An optical apparatus, comprising:
a mount substrate;
an optoelectronic device on the mount substrate;
a spacer on the mount substrate, the spacer including a hole exposing the optoelectronic device;
a cover on the spacer, the cover covering the hole, at least two of the mount substrate, the spacer and the cover together sealing the optoelectronic device; and
a metalized trench in the mount substrate, the metalized trench extending from the optoelectronic device to an edge of the mount substrate, a cross-section of the metalized trench at the edge of the mount substrate being exposed.

2. The optical apparatus as claimed in claim 1, wherein the mount substrate and the spacer are horizontally co-extensive.

3. The optical apparatus as claimed in claim 1, further comprising a ledge formed in the mount substrate extending beyond the spacer substrate, the metalized trench being in the ledge.

4. The optical apparatus as claimed in claim 1, wherein the metalized trench is wider near the edge of the mount substrate and near the optoelectronic device than between the edge and the optoelectronic device.

5. An optical apparatus, comprising:
a mount substrate;
an optoelectronic device on the mount substrate;
a spacer on the mount substrate, the spacer including a hole exposing the optoelectronic device;
a cover on the spacer, the cover covering the hole, at least two of the mount substrate, the spacer and the cover together sealing the optoelectronic device;
a via extending through a bottom surface of the mount substrate, sidewalls of the via being conductive, sidewalls of the via being electrically connected to the optoelectronic device; and
a conductive structure in the via, the conductive structure contacting the sidewalls of the via.

6. The optical apparatus as claimed in claim 5, wherein the conductive structure includes a solder ball.

7. An optical apparatus, comprising:
a mount substrate;
an optoelectronic device on the mount substrate;
a spacer on the mount substrate, the spacer including a hole exposing the optoelectronic device;
a cover on the spacer, the cover covering the hole, at least two of the mount substrate, the spacer and the cover together sealing the optoelectronic device;

a conductive material on the mount substrate and extending along at least two adjacent surfaces of the mount substrate, the conductive material being electrically connected to the optoelectronic device, wherein a first surface of the at least two adjacent surfaces is a surface on which the optoelectronic device is mounted and a second surface of the at least two adjacent surfaces is not orthogonal to the first surface.

8. The optical apparatus as claimed in claim 7, wherein the mount substrate is ceramic.

9. The optical apparatus as claimed in claim 7, further comprising a passive optical element on a terminal surface of the optical apparatus.

10. The optical apparatus as claimed in claim 7, further comprising a passive alignment feature on a terminal surface of the optical apparatus.

11. The optical apparatus as claimed in claim 7, wherein the cover has a planar surface facing the optoelectronic device.

12. The optical apparatus as claimed in claim 11, further comprising a passive optical element on a surface of the cover opposite the planar surface.

13. An optical apparatus, comprising:
a mount substrate;
an optoelectronic device on the mount substrate;
a spacer on the mount substrate, the spacer including a hole exposing the optoelectronic device;
a cover on the spacer, the cover covering the hole, at least two of the mount substrate, the spacer and the cover together sealing the optoelectronic device;
a via extending through a bottom surface of the mount substrate, sidewalls of the via being conductive, sidewalls of the via being electrically coupled to the optoelectronic device and
a conductive structure electrically coupled to the conductive sidewalls of the via.

14. The optical apparatus as claimed in claim 13, wherein the conductive structure includes a solder ball.

* * * * *